United States Patent
Behnen et al.

(10) Patent No.: US 9,971,861 B2
(45) Date of Patent: May 15, 2018

(54) SELECTIVE BOUNDARY OVERLAY INSERTION FOR HIERARCHICAL CIRCUIT DESIGN

(71) Applicant: International Business Machines Corporation, Armonk, NY (US)

(72) Inventors: Erwin Behnen, Austin, TX (US); Michael S. Gray, Fairfax, VT (US); Matthew T. Guzowski, Essex Junction, VT (US); David S. Wolpert, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 15/040,086

(22) Filed: Feb. 10, 2016

(65) Prior Publication Data
US 2017/0228486 A1    Aug. 10, 2017

(51) Int. Cl.
G06F 17/50    (2006.01)

(52) U.S. Cl.
CPC ...... *G06F 17/5072* (2013.01); *G06F 17/5081* (2013.01)

(58) Field of Classification Search
CPC ............ G06F 17/5081; G06F 17/5072; G06F 17/505; G06F 2217/66; G06F 17/5045
See application file for complete search history.

(56) References Cited

U.S. PATENT DOCUMENTS

| | | | | |
|---|---|---|---|---|
| 6,009,251 A | * | 12/1999 | Ho | G06F 17/5081 716/102 |
| 6,453,452 B1 | * | 9/2002 | Chang | G06F 17/5068 430/5 |
| 7,103,863 B2 | | 9/2006 | Riepe et al. | |
| 7,490,308 B2 | | 2/2009 | Gonzalez et al. | |
| 7,954,078 B1 | * | 5/2011 | Wang | G06F 17/505 716/106 |
| 8,046,730 B1 | * | 10/2011 | Ferguson | G06F 17/5068 716/100 |
| 8,141,016 B2 | | 3/2012 | Correale, Jr. et al. | |
| 8,510,685 B1 | * | 8/2013 | Rossman | G06F 17/5068 716/50 |

(Continued)

OTHER PUBLICATIONS

N. Hedenstierna, et al.,"The Halo Algorithm—An Algorithm for Hierarchical Design of Rule Checking of VLSI Circuits" IEEE Transactions on Computer-Aided Design of Integrated circuits and Sytems,vol. 2 No. 2, Feb. 1993, p. 1-8.

*Primary Examiner* — Nha Nguyen
(74) *Attorney, Agent, or Firm* — Cantor Colburn LLP; Margaret A. McNamara

(57) ABSTRACT

Aspects include techniques for selective boundary overlay insertion for hierarchical circuit design. A method may include determining, by a processing device, a block type of a child block. The method may further include electively inserting, by the processing device, at least one of an instantiated boundary overlay and a merged boundary overlay into the hierarchical circuit design based on the block type of the child block. The instantiated boundary overlay enables a parent block to pass a testing at an out-of-context level, and the merged boundary overlay enables the parent block to continue to pass the testing when the child block is inserted into the parent block associated with the child block.

14 Claims, 5 Drawing Sheets

(56) References Cited

U.S. PATENT DOCUMENTS

| | | | |
|---|---|---|---|
| 8,539,416 B1* | 9/2013 | Rossman | G06F 17/5081 716/118 |
| 8,701,071 B2 | 4/2014 | Kornachuk et al. | |
| 8,839,171 B1* | 9/2014 | Varadarajan | G06F 17/5045 716/113 |
| 9,552,453 B1* | 1/2017 | Agarwal | G06F 17/5077 |
| 2004/0049754 A1* | 3/2004 | Liao | G06F 17/5068 716/120 |
| 2005/0132320 A1 | 6/2005 | Allen et al. | |
| 2005/0240886 A1* | 10/2005 | Bonges, III | G06F 17/5081 716/115 |
| 2005/0251767 A1* | 11/2005 | Shah | G06F 17/5018 716/106 |
| 2007/0226662 A1* | 9/2007 | Pokorny | G06F 17/5081 716/52 |
| 2008/0109772 A1* | 5/2008 | Pokorny | G06F 17/5081 716/52 |
| 2009/0113368 A1* | 4/2009 | Lin | G06F 17/5068 716/122 |
| 2013/0239080 A1* | 9/2013 | Sarwary | G06F 17/5022 716/113 |
| 2014/0201694 A1* | 7/2014 | Graupp | G06F 17/5072 716/119 |
| 2014/0298278 A1* | 10/2014 | Badar | G06F 17/5068 716/104 |
| 2016/0098512 A1* | 4/2016 | Pikus | G06F 17/5072 716/52 |
| 2016/0171149 A1* | 6/2016 | Alloatti | G06F 17/5072 716/52 |

* cited by examiner

SELECTIVE BOUNDARY OVERLAY INSERTION FOR HIERARCHICAL CIRCUIT DESIGN

BACKGROUND

The present disclosure relates to circuit design and, more particularly, to techniques for selective boundary overlay insertion for hierarchical circuit design.

Hierarchical circuit design refers to techniques in which layers of abstraction are used to enable concurrent design of embedded components and top-level components and to enable reduced memory requirements by hiding self-contained portions of a design from automation or verification tools. The desire to abstract embedded components can result in false verification failures that do not show up when the hierarchy is flattened but may prevent a piece of the hierarchy from achieving clean checking grades. Moreover, this can drown out real failures, potentially causing design defects.

SUMMARY

According to an embodiment a method, system, and computer program product for selective boundary overlay insertion for hierarchical circuit design are provided. A method may include determining, by a processing device, a block type of a child block. The method may further include electively inserting, by the processing device, at least one of an instantiated boundary overlay and a merged boundary overlay into the hierarchical circuit design based on the block type of the child block. The instantiated boundary overlay enables a parent block to pass a testing at an out-of-context level, and the merged boundary overlay enables the parent block to continue to pass the testing when the child block is inserted into the parent block associated with the child block.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages thereof, are apparent from the following detailed description taken in conjunction with the accompanying drawings in which:

DETAILED DESCRIPTION

Figure 1:
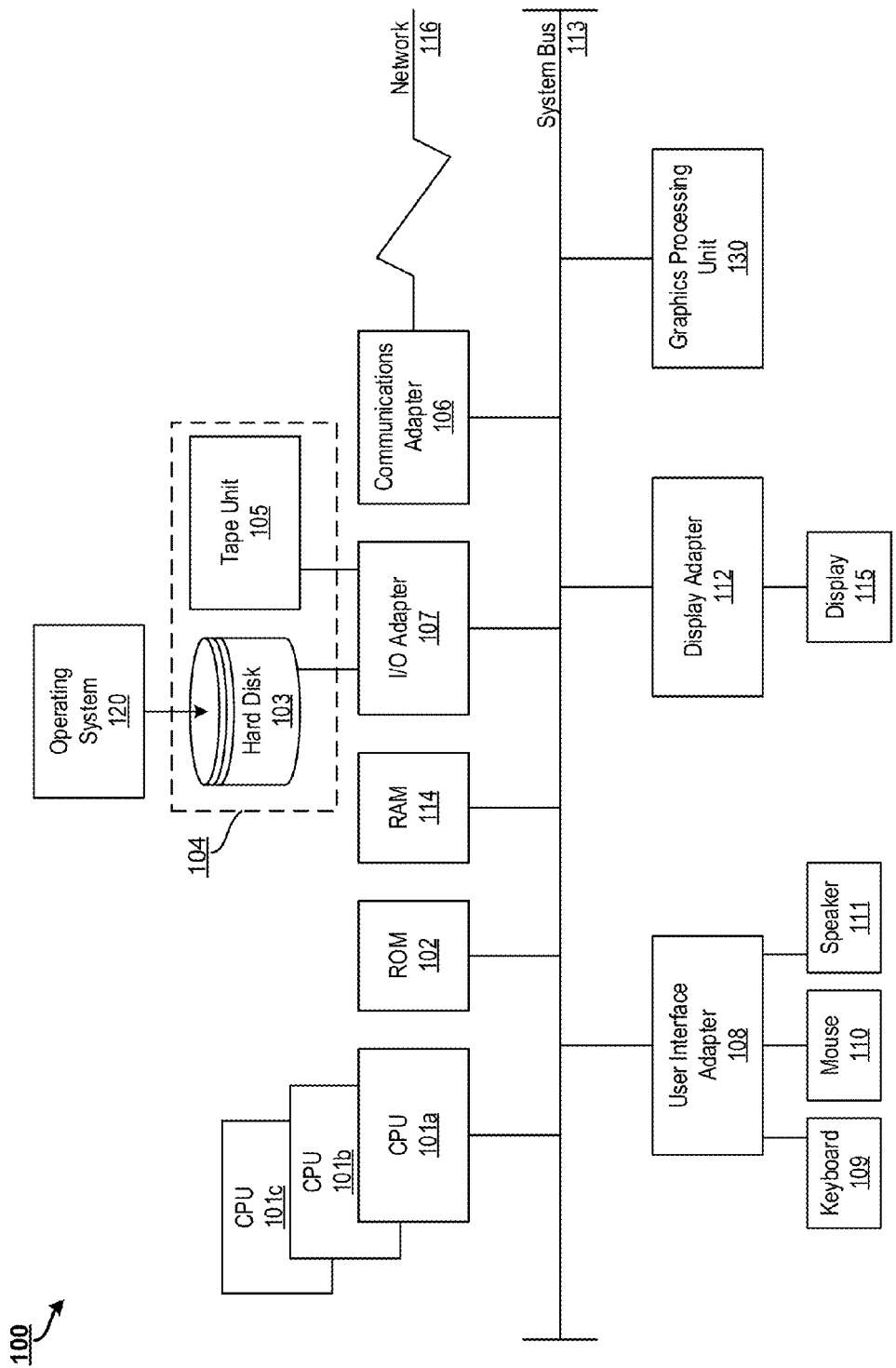
FIG. 1 illustrates a block diagram of a processing system for implementing the techniques described herein according to embodiments of the present disclosure.

The present disclosure relates to a hierarchical circuit design that uses layers of abstraction to concurrently design embedded components (child cells) and top-level components (parent cells). The present embodiments enable selectively applying two types of boundary overlays to a block or shape of a hierarchical circuit design: an instantiated boundary overlay and a merged boundary overlay. The instantiated overlay aids the parent in passing testing when the child is abstracted out-of-context level but it is also utilized for the parent to pass checking when the child is not abstracted (i.e., when the child is inserted into the parent in context). The merged overlay is utilized for two purposes: filling in for blocks that are known to exist at the parent level, and filling in for shapes that are known to exist in any child blocks. For the former, it ensures that the parent will pass testing under the assumption that any parent-grandparent boundaries (whether at the outer edges of the parent on in an interior socket, as illustrated in FIG. 4B) will contain the correct blocks when the parent is inserted into the grandparent. For the latter, it ensures that when the child is abstracted at the parent level, certain blocks used for checking (that will be present when the child abstract is replaced by a layout) are temporarily created to enable the parent to pass testing. The present techniques enable maintained validity checking at the parent level that includes the overlays placed at the parent level to both temporarily fill in for the other layers of hierarchy and permanently fix fails that are known to be caused by certain hierarchical boundary combinations.

Hierarchical circuit design refers to systems in which layers of abstraction are used to enable concurrent design of embedded components and top-level components. In embodiments, a hierarchical circuit design may include various layers with blocks of each layer. In one embodiment, a chip layer may contain a chiplet layer. The chiplet layer may contain a core layer. The core layer may contain a unit layer. The unit layer may contain a random logic macro layer. The random logic macro (RLM) layer may contain a custom designed circuit layer (also referred to as an IP layer). The IP layer may contain a cell layer that may include logic gates (e.g., NAND gates, OR gates, AND gates, XOR gates, NOR gates, etc.).

The desire to abstract embedded components can result in false verification fails that do not show up when the hierarchy is flattened but do prevent a piece of the hierarchy from achieving clean testing (or checking) grades. Moreover, the abstracted approach can drown out real fails, which may potentially cause design defects.

The creation of a simple checking cell within the hierarchical circuit design can be insufficient to test the hierarchical circuit design adequately because the shapes added depend on the type of embedded design. In embodiments, a verification tool handling the abstracted areas may not know what is inside those areas by looking at the shapes available. For example, some designs need separate types of north/south (N/S) and east/west (E/W) fill indicators while others only need a N/S fill indicator. To solve this problem, the techniques for selectively applying two types of boundary overlays are disclosed herein.

Hierarchical circuit design reduces memory requirements by hiding self-contained portions of a design from tools used for automation, verification, and/or testing. In order to verify the circuit design, each piece of a design is checked individually out-of-context as well as after the pieces are combined with the top-level components. These and other advantages will be apparent from the description that follows.

FIG. 1 illustrates a block diagram of a processing system 100 for implementing the techniques described herein. In embodiments, the processing system 100 has one or more central processing units (processors) 101a, 101b, 101c, etc. (collectively or generically referred to as processor(s) 101). In aspects of the present disclosure, each processor 101 may include a reduced instruction set computer (RISC) microprocessor. Processors 101 are coupled to system memory (e.g., random access memory (RAM) 114 and various other components via a system bus 113. Read only memory (ROM) 102 is coupled to the system bus 113 and may include a basic input/output system (BIOS), which controls certain basic functions of the processing system 100.

FIG. 1 further illustrates an input/output (I/O) adapter 107 and a communications adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling the processing system 100 to communicate with other such systems.

A screen (e.g., a display monitor) 115 is connected to system bus 113 by display adaptor 112, which may include a graphics adapter to improve the performance of graphics intensive applications and a video controller. In one aspect of the present disclosure, adapters 106, 107, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In some aspects of the present disclosure, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the processing system 100 includes processing capability in the form of processors 101, storage capability including system memory 114 and mass storage 104, input means such as keyboard 109 and mouse 110, and output capability including speaker 111 and display 115. In some aspects of the present disclosure, a portion of system memory 114 and mass storage 104 collectively store an operating system such as the AIX® operating system from IBM Corporation to coordinate the functions of the various components shown in FIG. 1.

Figure 2:
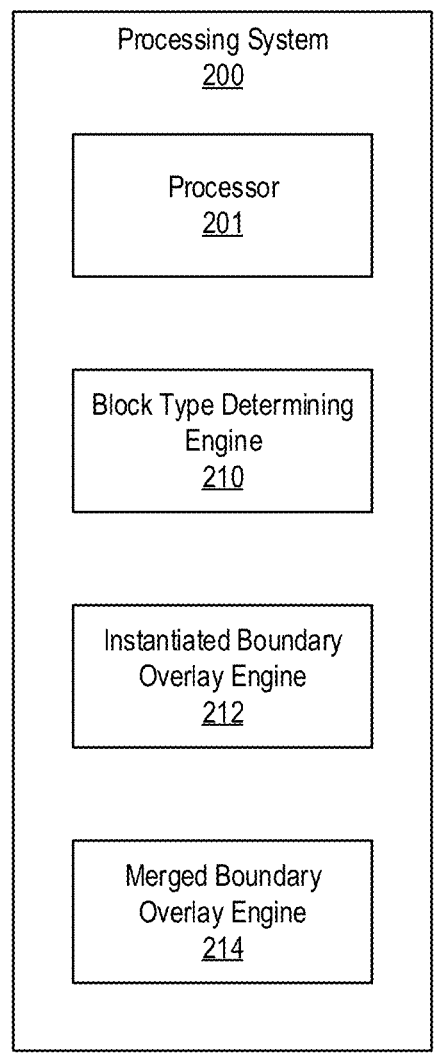
FIG. 2 illustrates a block diagram of a processing system for selective boundary overlay insertion for hierarchical circuit design according to embodiments of the present disclosure.

FIG. 2 illustrates a block diagram of a processing system 200 for selective boundary overlay insertion for hierarchical circuit design according to embodiments of the present disclosure. The various components, modules, engines, etc. described regarding FIG. 2 may be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In embodiments, the engine(s) described herein may be a combination of hardware and programming. The programming may be processor executable instructions stored on a tangible memory, and the hardware may include processing device 201 for executing those instructions. Thus system memory 114 of FIG. 1 can store program instructions that when executed by processing device 201 implement the engines described herein. Other engines may also be utilized to include other features and functionality described in other embodiments herein.

Processing system 200 may include processing device 201, block type determining engine 210, instantiated boundary overlay engine 212, and merged boundary overlay engine 214. Alternatively or additionally, the processing system 200 may include dedicated hardware, such as one or more integrated circuits, Application Specific Integrated Circuits (ASICs), Application Specific Special Processors (ASSPs), Field Programmable Gate Arrays (FPGAs), or any combination of the foregoing embodiments of dedicated hardware, for performing the techniques described herein.

Block type determining engine 210 determines a block type of a child block. For example, a child block may be at least an IP block or a gate level block. If it is determined that the child block is an IP block, an instantiated boundary overlay is to be applied by the instantiated boundary overlay engine 212. However, if it is determined that the child block is a gate level block, a merged boundary overlay is to be applied by the merged boundary overlay engine 214.

Instantiated boundary overlay engine 212 inserts an instantiated boundary overlay into the hierarchical circuit design when it is determined that the child block is an IP block. The instantiated boundary overlay aids the parent block (in this case, the block containing the IP block) in passing a testing or verification at an out-of-context level. An example of a parent block containing an IP block with an instantiated boundary overlay applied is described below with reference to FIG. 4A.

Merged boundary overlay engine 214 inserts a merged boundary overlay into the hierarchical design when it is determined that the child block is a gate level block. The merged boundary overlay aids the parent block (in this case, a gate level block) in continuing to pass the testing when the abstracted child block is inserted into a parent block associated with the child block. The merged boundary overlay also aids the parent block in continuing to pass the testing at the boundaries shared by the parent block and its parent block (referred to as a grandparent block). An embodiment of a gate level block with a merged boundary overlay applied is described below with reference to FIG. 4B.

Figure 3:
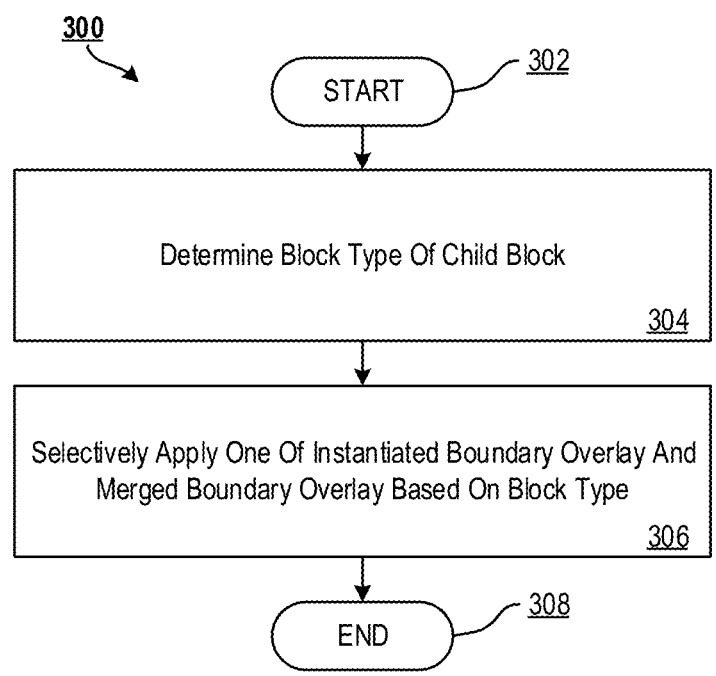
FIG. 3 illustrates a flow diagram of a method for boundary overlay insertion for hierarchical circuit design according to embodiments of the present disclosure.

FIG. 3 illustrates a flow diagram of a method 300 for boundary overlay insertion for hierarchical circuit design according to embodiments of the present disclosure. Method 300 starts at block 302 and continues to block 304. At block 304, method 300 includes determining a block type of a child block. At block 306, method 300 includes selectively inserting at least one of an instantiated boundary overlay and a merged boundary overlay based on the block type of the child block. The instantiated boundary overlay enables the parent block to pass a testing at an out-of-context level (e.g., testing at the parent level with abstracted children). The merged boundary overlay enables the parent block to continuing to pass the testing when the child block is replaced with an abstracted form inside a parent block.

In embodiments, the instantiated boundary overlay remains with the parent block when the child block is inserted into the parent block associated with the child block while the portion of the merged boundary overlay associated with the child block is removed from the parent block when the parent block includes the child block in-context (e.g., a layout) rather than out-of-context (e.g., an abstracted view).

The instantiated boundary overlay may be applied when it is determined that the child block is, for example, a custom designed circuit block type (e.g., an IP block). In such case, the instantiated boundary overlay may include both a north/south boundary and an east/west boundary as discussed below regarding FIG. 4A.

The merged boundary overlay may be applied when it is determined that the child block is, for example, a gate level block type. In this case, he merged boundary overlay comprises an east/west boundary but no north/south boundary is needed as discussed below regarding FIG. 4B.

Additional processes also may be included, and it should be understood that the processes depicted in FIG. 3 represent illustrations, and that other processes may be added or existing processes may be removed, modified, or rearranged without departing from the scope and spirit of the present disclosure.

Figure 4A:
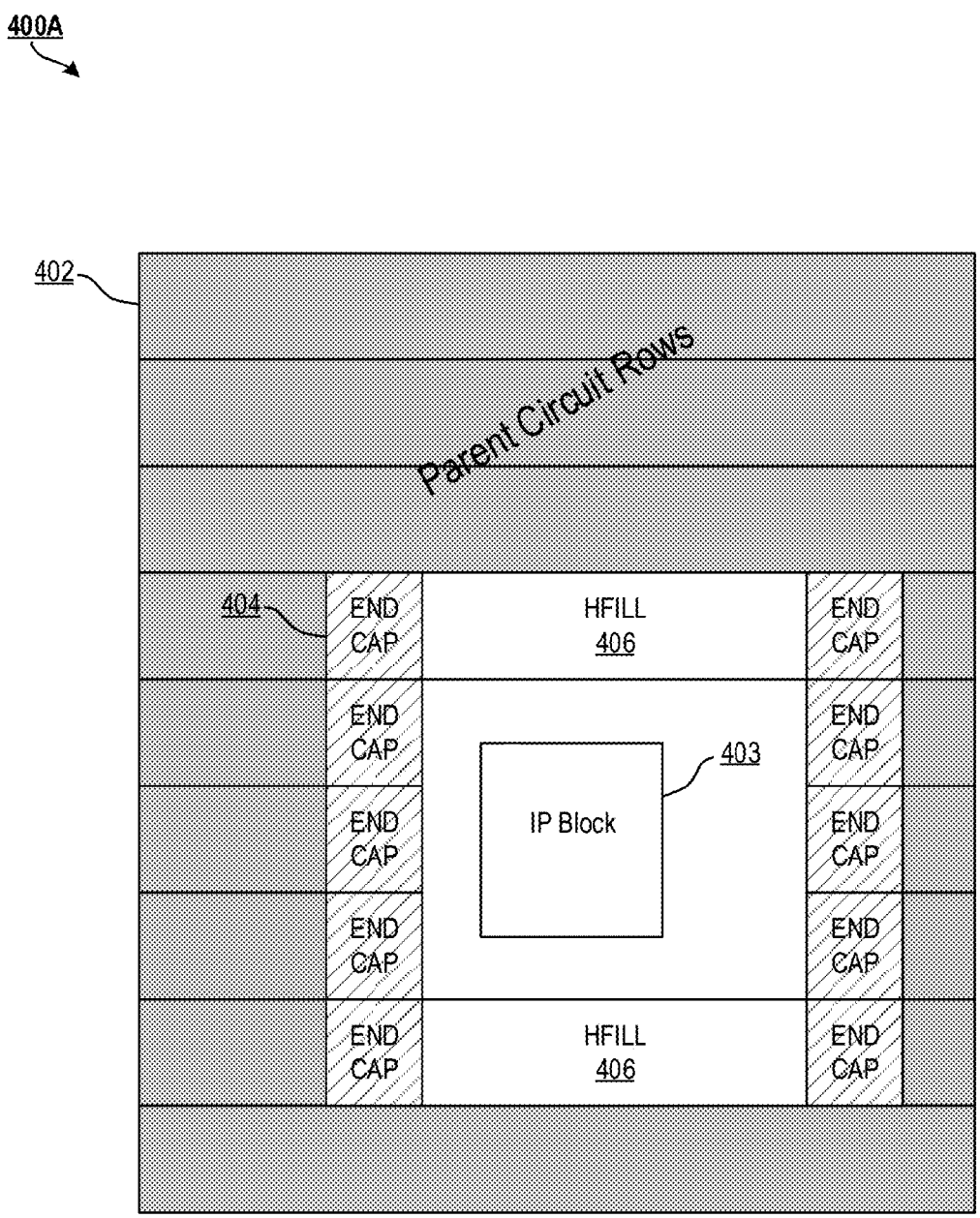
FIG. 4A illustrates a hierarchical circuit design 400A applying an instantiated boundary overlay to a custom designed circuit block (e.g., an IP block) according to embodiments of the present disclosure.
Figure 4B:
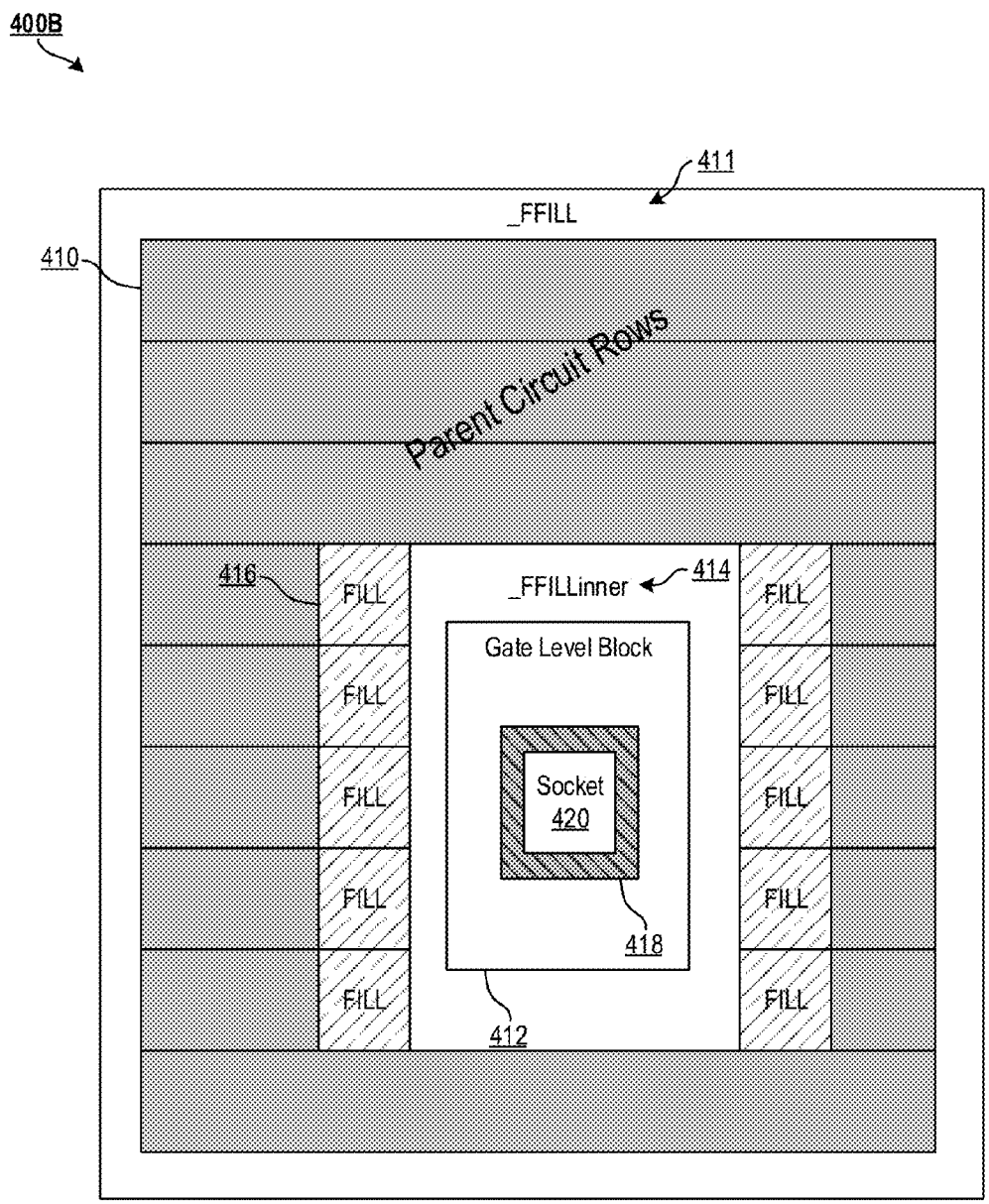
FIG. 4B illustrates a hierarchical circuit design 400B applying a merged boundary overlay to a gate level block according to embodiments of the present disclosure.

FIG. 4A illustrates a hierarchical circuit design 400A applying an instantiated boundary overlay to a custom designed circuit block (e.g., an IP block) according to embodiments of the present disclosure. In particular, FIG. 4A illustrates a parent 402 that contains parent circuit rows and a child 403 embedded in the parent. In this case, child 403 is a custom designed circuit block (e.g., an IP block). Thus, an instantiated overlay is used to embed child 403 in parent 402. The instantiated overlay is needed to verify the design across the hierarchy since the region between the circuit rows is open. Accordingly, end caps 404 are added to bound east/west edges of child 403 and _HFILL 406 is added to bound the north/south edges of child 403.

FIG. 4B illustrates a hierarchical circuit design 400B applying a merged boundary overlay to a gate level block according to embodiments of the present disclosure. In the present embodiment, the gate-level block refers to the cutout area of the parent circuit rows, which includes FFILLinner region 414 as well as the socket 420 and _FFILLsocket region 418. In particular, FIG. 4B illustrates a parent 410 that contains parent circuit rows and a child 412 embedded in the parent. In this case, child 412 is a gate level block and parent 410 is also a gate level block. Thus, a merged overlay is used to embed child 412 in parent 410. The merged overlay is needed to verify the design only until child 412 is placed in-context (e.g., layout instead of abstract) into parent 410. The FILL 416 provides an east/west bound between parent 410 and child 412. The _FFILL 411 portion of the merged overlay is only needed for the outer edges of gate level blocks while the _FFILLinner region 414 portion of the merged overlay is only needed for interior edges of gate level blocks with embedded gate level blocks. The _FFILLsocket region 418 of the merged overlay is needed for exterior edges of socket shapes (e.g., socket 420) that may be placed inside either IP blocks (such as in FIG. 4A) or gate level bocks (such as in FIG. 4B).

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific embodiments of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A computer-implemented method for boundary overlay insertion for hierarchical circuit design, the method comprising:
   determining, by a processing device, a block type of a child block, wherein the block type is one of a custom designed circuit block type and a gate level block type;
   inserting, by the processing device, an instantiated boundary overlay into the hierarchical circuit design based on the block type of the child block being the custom designed circuit block type;
   inserting, by the processing device, a merged boundary overlay into the hierarchical circuit design based on the block type of the child block being the gate level block type,
   wherein the instantiated boundary overlay enables a parent block to pass a testing at an out-of-context level, and
   wherein the merged boundary overlay enables the parent block to continue to pass the testing when the child block is inserted into the parent block associated with the child block; and
   causing a circuit to be fabricated based at least in part on the hierarchical circuit design subsequent to passing the testing.

2. The computer-implemented method of claim 1, wherein the instantiated boundary overlay remains with the parent block when the child block is inserted into the parent block associated with the child block.

3. The computer-implemented method of claim 1, wherein the merged boundary overlay is removed from the parent block when the child block is inserted into the parent block associated with the child block.

4. The computer-implemented method of claim 1, wherein the instantiated boundary overlay comprises a north/south boundary and an east/west boundary.

5. The computer-implemented method of claim 1, wherein the merged boundary overlay comprises an east/west boundary.

6. A system for boundary overlay insertion for hierarchical circuit design, the system comprising:
   a memory having computer readable instructions; and
   a processor for executing the computer readable instructions, the computer readable instructions comprising:
   determining a block type of a child block, wherein the block type is one of a custom designed circuit block type and a gate level block type;
   inserting an instantiated boundary overlay into the hierarchical circuit design based on the block type of the child block being the custom designed circuit block type;
   inserting a merged boundary overlay into the hierarchical circuit design based on the block type of the child block being the gate level block type,
   wherein the instantiated boundary overlay enables a parent block to pass a testing at an out-of-context level, and
   wherein the merged boundary overlay enables the parent block to continue to pass the testing when the child block is inserted into the parent block associated with the child block; and causing a circuit to be fabricated based at least in part on the hierarchical circuit design subsequent to passing the testing.

7. The system of claim 6, wherein the instantiated boundary overlay remains with the parent block when the child block is inserted into the parent block associated with the child block.

8. The system of claim 6, wherein the merged boundary overlay is removed from the parent block when the child block is inserted into the parent block associated with the child block.

9. The system of claim 6, wherein the instantiated boundary overlay comprises a north/south boundary and an east/west boundary.

10. The system of claim 6, wherein the merged boundary overlay comprises an east/west boundary.

11. A computer program product for boundary overlay insertion for hierarchical circuit design, the computer program product comprising:
 a computer readable storage medium having program instructions embodied therewith, the program instructions executable by a computer processor to cause the computer processor to:
  determine a block type of a child block, wherein the block type is one of a custom designed circuit block type and a gate level block type;
  insert an instantiated boundary overlay into the hierarchical circuit design based on the block type of the child block being the custom designed circuit block type;
  insert a merged boundary overlay into the hierarchical circuit design based on the block type of the child block being the gate level block type,
  wherein the instantiated boundary overlay enables a parent block to pass a testing at an out-of-context level, and
  wherein the merged boundary overlay enables the parent block to continue to pass the testing when the child block is inserted into the parent block associated with the child block; and
  cause a circuit to be fabricated based at least in part on the hierarchical circuit design subsequent to passing the testing.

12. The computer program product of claim 11, wherein the instantiated boundary overlay remains with the parent block when the child block is inserted into the parent block associated with the child block.

13. The computer program product of claim 11, wherein the merged boundary overlay is removed from the parent block when the child block is inserted into the parent block associated with the child block.

14. The computer program product of claim 11, wherein the instantiated boundary overlay comprises a north/south boundary and an east/west boundary.

* * * * *